(12) United States Patent
Matsuhashi et al.

(10) Patent No.: US 11,127,615 B2
(45) Date of Patent: Sep. 21, 2021

(54) SUBSTRATE PROCESSING SYSTEM AND SUBSTRATE TRANSFER METHOD

(71) Applicant: Tokyo Electron Limited, Tokyo (JP)

(72) Inventors: Takafumi Matsuhashi, Yamanashi (JP); Kunio Takano, Yamanashi (JP); Toshiharu Hirata, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 164 days.

(21) Appl. No.: 16/455,934

(22) Filed: Jun. 28, 2019

(65) Prior Publication Data
US 2020/0013654 A1    Jan. 9, 2020

(30) Foreign Application Priority Data

Jul. 4, 2018 (JP) .............................. JP2018-127757

(51) Int. Cl.
*H01L 21/677* (2006.01)

(52) U.S. Cl.
CPC .... *H01L 21/67745* (2013.01); *H01L 21/6773* (2013.01)

(58) Field of Classification Search
CPC .................. H01L 21/6773; H01L 21/67745
See application file for complete search history.

(56) References Cited

U.S. PATENT DOCUMENTS

2006/0155412 A1* 7/2006 Ikeda ............... G05B 19/41865
700/112

FOREIGN PATENT DOCUMENTS

| JP | 2010-153473 A | 7/2010 |
| JP | 6160614 B | 6/2017 |
| KR | 10-2013-0019098 A | 2/2013 |
| KR | 10-2018-0025290 A | 3/2018 |

* cited by examiner

*Primary Examiner* — Mark A Connolly
(74) *Attorney, Agent, or Firm* — Abelman, Frayne & Schwab

(57) ABSTRACT

A substrate processing system includes a processing section that includes a plurality of process modules each of which performs a predetermined processing; a carrying-in/out section that holds the plurality of substrates, and carries the substrates into/out of the processing section; a transfer unit that transfers the substrates; and a controller that controls the processing section, the carrying-in/out section, and the transfer unit. The controller performs a control such that the plurality of substrates is sequentially transferred from the carrying-in/out section to the processing section, and the transferred substrates are sequentially and serially transferred to the plurality of process modules, sets an interval until a next substrate is unloaded after a substrate is unloaded from a predetermined module of the carrying-in/out section, and performs a control such that the plurality of substrates is sequentially unloaded from the predetermined module with a setting value of the interval.

19 Claims, 4 Drawing Sheets

SUBSTRATE PROCESSING SYSTEM AND SUBSTRATE TRANSFER METHOD

CROSS-REFERENCE TO RELATED APPLICATIONS

This application is based on and claims priority from Japanese Patent Application No. 2018-127757, filed on Jul. 4, 2018, with the Japan Patent Office, the disclosures of which are incorporated herein in their entireties by reference.

TECHNICAL FIELD

The present disclosure relates to a substrate processing system, a substrate transfer method, and a storage medium that stores a control program.

BACKGROUND

There has been suggested a substrate processing system that performs processings on a plurality of substrates (e.g., Japanese Patent No. 6160614). The substrate processing system includes a plurality of processing modules each of which performs a predetermined processing, and a transfer mechanism that transfers the substrates to these processing modules, in which a control is performed to sequentially and serially transfer the substrates to the processing modules.

SUMMARY

A substrate processing system according to an embodiment of the present disclosure is a substrate processing system that performs a processing on a plurality of substrates. The substrate processing system includes: a processing enclosure that includes a plurality of process modules each of which performs a predetermined processing; a carrying-in/out unit including a substrate holder that holds the plurality of substrates, and carries the substrates into/out of the processing enclosure; a transfer unit including a transfer arm that transfers the substrates to each of the plurality of process modules, and transfers the substrates within the carrying-in/out unit and between the carrying-in/out unit and the processing enclosure; and a controller that controls the processing enclosure, the carrying-in/out unit, and the transfer unit. The controller performs a control such that the plurality of substrates is sequentially transferred from the carrying-in/out unit to the processing enclosure, and the transferred substrates are sequentially and serially transferred to the plurality of process modules, sets an interval until a next substrate is unloaded after a substrate is unloaded from a predetermined module of the carrying-in/out unit, and performs a control such that the plurality of substrates is sequentially unloaded from the predetermined module with a setting value of the interval.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Figure 1:
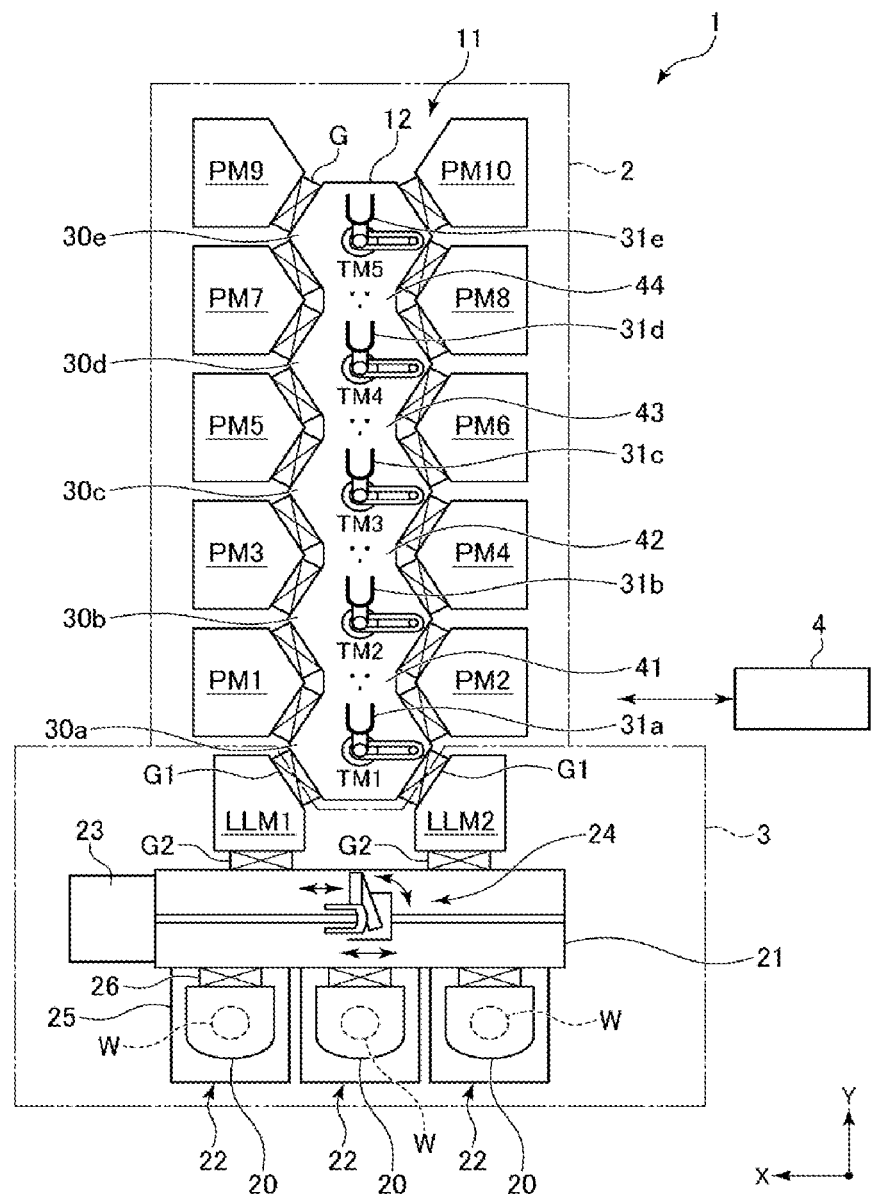
FIG. 1 is a schematic sectional view illustrating a substrate processing system according to an embodiment.

FIG. 1 is a schematic sectional view illustrating a substrate processing system according to the embodiment.

The substrate processing system 1 performs a plurality of processings on substrates W, and includes a processing section 2, a carry-in/out section 3 that holds a plurality of substrates W and carries the substrates into/out of the processing section 2, and a controller 4. The substrate is not particularly limited, but is, for example, a semiconductor wafer.

The processing section 2 includes a plurality of (ten in this example) process modules PM1 to PM10 which perform predetermined vacuum processings on the substrates W. The substrates W are sequentially transferred to these process modules PM1 to PM10 by a first transfer device 11. The first transfer device 11 includes a plurality of transfer modules TM1 to TM5. The transfer modules TM1 to TM5 include containers 30a, 30b, 30c, 30d, and 30e each of which is kept in vacuum and has a hexagonal planar shape, and multi-joint structure transfer mechanisms 31a, 31b, 31c, 31d, and 31e provided in the containers, respectively. Delivery units 41, 42, 43, and 44 as transfer buffers are provided between the transfer mechanisms of the transfer modules TM1 to TM5. The containers 30a, 30b, 30c, 30d, and 30e of the transfer modules TM1 to TM5 communicate with each other to constitute one transfer chamber 12. The transfer chamber 12 extends in the Y direction in the drawing, and five of the process modules PM1 to PM10 are connected to each of two sides of the transfer chamber 12 via gate valves G which are openable and closable. The gate valves G of the process modules PM1 to PM10 are opened when the transfer modules access the process modules, and are closed when processings are being performed.

The carry-in/out section 3 is connected to one end side of the processing section 2. The carry-in/out section 3 includes an atmospheric transfer chamber (EFEM) 21, three load ports 22, an aligner module 23, and two load lock modules LLM1 and LLM2, which are connected to the atmospheric transfer chamber 21, and a second transfer device 24 provided in the atmospheric transfer chamber 21.

The atmospheric transfer chamber 21 has a rectangular parallelpiped shape whose longitudinal direction is the X direction in the drawing. The three load ports 22 are provided on a long side wall of the atmospheric transfer chamber 21 opposite to the processing section 2. Each of the load ports 22 includes a stage 25 and a transfer port 26. An FOUP 20 is placed on the stage 25. The FOUP 20 is a substrate accommodating container that accommodates the plurality of substrates. The FOUP 20 on the stage 25, in a sealed state, is connected to the atmospheric transfer chamber 21 via the transfer port 26.

The aligner module 23 is connected to one short side wall of the atmospheric transfer chamber 21. In the aligner module 23, alignment of the substrates W is performed.

The two load lock modules LLM1 and LLM2 are configured to enable transfer of the substrates W between the atmospheric transfer chamber 21 at atmospheric pressure and the transfer chamber 12 at vacuum atmosphere, and the pressure thereof is variable between the atmospheric pressure and the same degree of vacuum as the transfer chamber 12. Each of the two load lock modules LLM1 and LLM2 includes two transfer ports. One transfer port is connected to a long side wall of the atmospheric transfer chamber 21 on the processing section 2 side via a gate valve G2, and the other transfer port is connected to the transfer chamber 12 of the processing section 2 via a gate valve G1. The load lock module LLM1 is used when the substrates W are transferred from the carry-in/out section 3 to the processing section 2, and the load lock module LLM2 is used when the substrates W are transferred from the processing section 2 to the carry-in/out section 3. A processing such as degassing may be performed in the load lock modules LLM1 and LLM2.

The second transfer device 24 in the atmospheric transfer chamber 21 has a multi-joint structure, and transfers the substrates W to the FOUPs 20 on the load ports 22, the aligner module 23, and the load lock modules LLM1 and LLM2. Specifically, the second transfer device 24 takes out an unprocessed substrate W from the FOUP 20 of the load port 22, transfers the unprocessed substrate W to the aligner module 23, and transfers the substrate W from the aligner module 23 to the load lock module LLM1. The second transfer device 24 receives a processed substrate W transferred from the processing section 2 to the load lock module LLM2, and transfers the substrate W to the FOUP 20 of the load port 22. FIG. 1 illustrates an example in which one pick of the second transfer device 24 receives the substrate W, but two picks may be employed.

The first transfer device 11 and the second transfer device 24 constitute a transfer unit of the substrate processing system 1.

In the processing section 2, the process modules PM1, PM3, PM5, PM7, and PM9 are disposed in order from the load lock module LLM1 side, on one side of the transfer chamber 12, and the process modules PM2, PM4, PM6, PM8, and PM10 are disposed in order from the load lock module LLM2 side, on the other side of the transfer chamber 12. In the first transfer device 11, the transfer modules TM1, TM2, TM3, TM4, and TM5 are disposed in order from the load lock modules LLM1 and LLM2 side.

The transfer mechanism 31a of the transfer module TM1 is capable of accessing the load lock modules LLM1 and LLM2, the process modules PM1 and PM2, and the delivery unit 41. The transfer mechanism 31b of the transfer module TM2 is capable of accessing the process modules PM1, PM2, PM3 and PM4, and the delivery units 41 and 42. The transfer mechanism 31c of the transfer module TM3 is capable of accessing the process modules PM3, PM4, PM5 and PM6, and the delivery units 42 and 43. The transfer mechanism 31d of the transfer module TM4 is capable of accessing the process modules PM5, PM6, PM7 and PM8, and the delivery units 43 and 44. The transfer mechanism 31e of the transfer module TM5 is capable of accessing the process modules PM7, PM8, PM9 and PM10, and the delivery unit 44.

Figure 2:
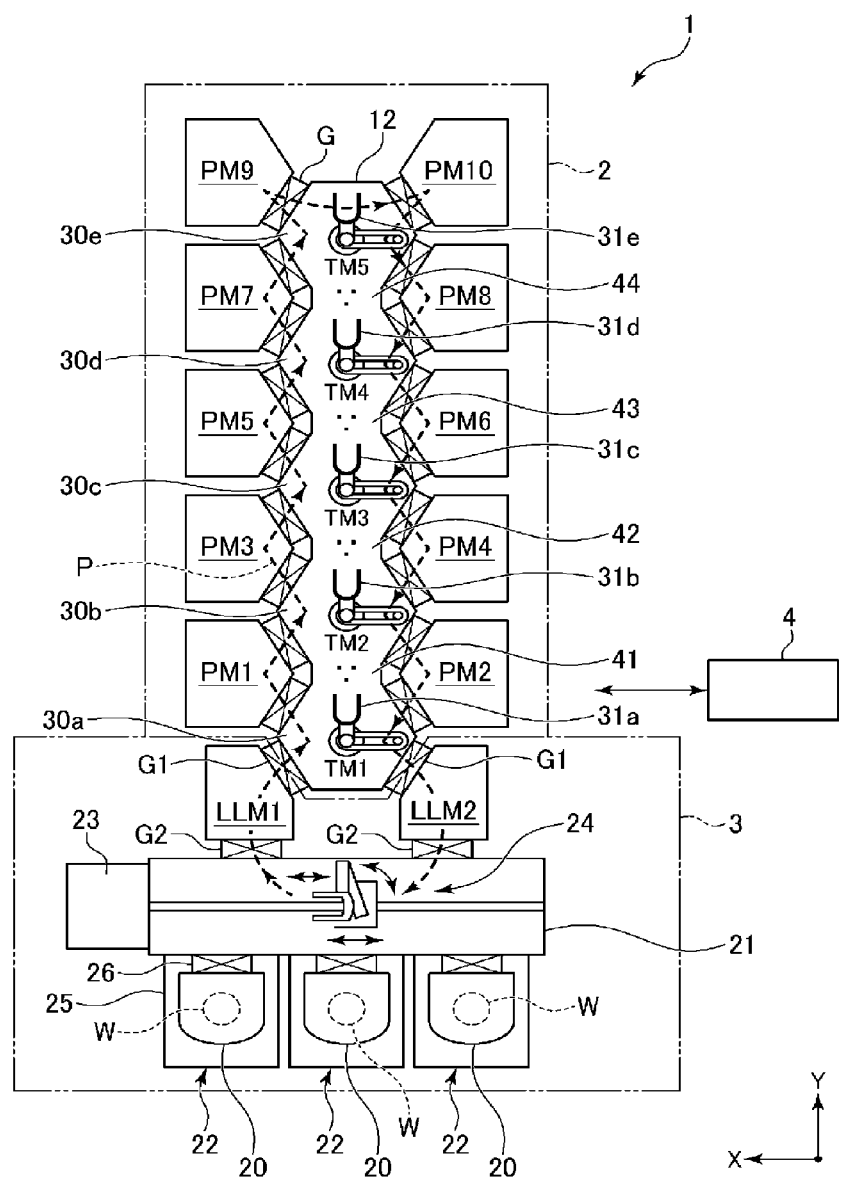
FIG. 2 is a schematic sectional view illustrating a transfer path of a substrate in the substrate processing system according to the embodiment.

Since the second transfer device 24 and the transfer modules TM1 to TM5 of the first transfer device 11 are configured in this manner, as illustrated in FIG. 2, the substrate W taken out from the FOUP 20 is serially transferred in one direction along a substantially U-shaped path P in the processing section 2, is processed in each process module, and is returned to the FOUP 20. That is, the substrate W is transferred in the order of the process modules PM1, PM3, PM5, PM7, PM9, PM10, PM8, PM6, PM4, and PM2 and is subjected to a predetermined processing in each process module.

The substrate processing system 1 may be used in manufacturing a stacked film (MTJ film) used for, for example, a Magnetoresistive Random Access Memory (MRAM). In the manufacturing of the MTJ film, there is a plurality of processings such as a pre-cleaning processing, a film forming processing, an oxidizing processing, a heating processing, and a cooling processing. Each of these processings is performed in the process modules PM1 to PM10. One or more of the process modules PM1 to PM10 may be stand-by modules which allow the substrate W to stand by.

Figure 3:
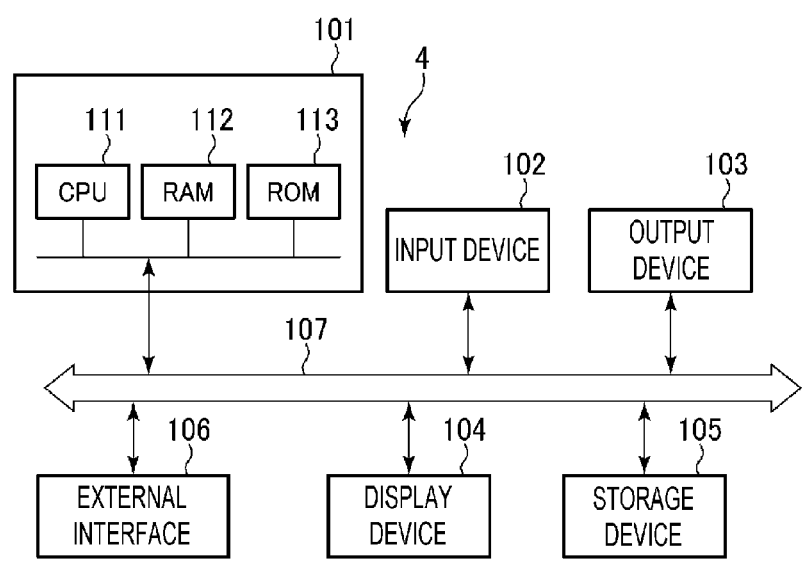
FIG. 3 is a block diagram illustrating an example of a hardware configuration of a controller in the substrate processing system according to the embodiment.

The controller 4 controls each of components of the substrate processing system 1, for example, the transfer modules TM1 to TM5 (the transfer mechanisms 31a to 31e) and the second transfer device 24, the process modules PM1 to PM10, the load lock modules LLM1 and LLM2, the transfer chamber 12, and the gate valves G, G1, and G2. The controller 4 is typically a computer. FIG. 3 illustrates an example of a hardware configuration of the controller 4. The controller 4 includes a main controller 101, an input device 102 such as a keyboard or a mouse, an output device 103 such as a printer, a display device 104, a storage device 105, an external interface 106, and a bus 107 by which these are connected to each other. The main controller 101 includes a CPU (a central processing unit) 111, a RAM 112, and a ROM 113. The storage device 105 is configured to write and read information required for control. The storage device 105 includes a computer-readable storage medium, and the storage medium stores, for example, a processing recipe on processings for the substrates W.

In the controller 4, the CPU 111 executes a program stored in the ROM 113 or the storage medium of the storage device 105 by using the RAM 112 as a work area so as to cause the substrate processing system 1 to execute processings on wafers W as the substrates.

Figure 4:
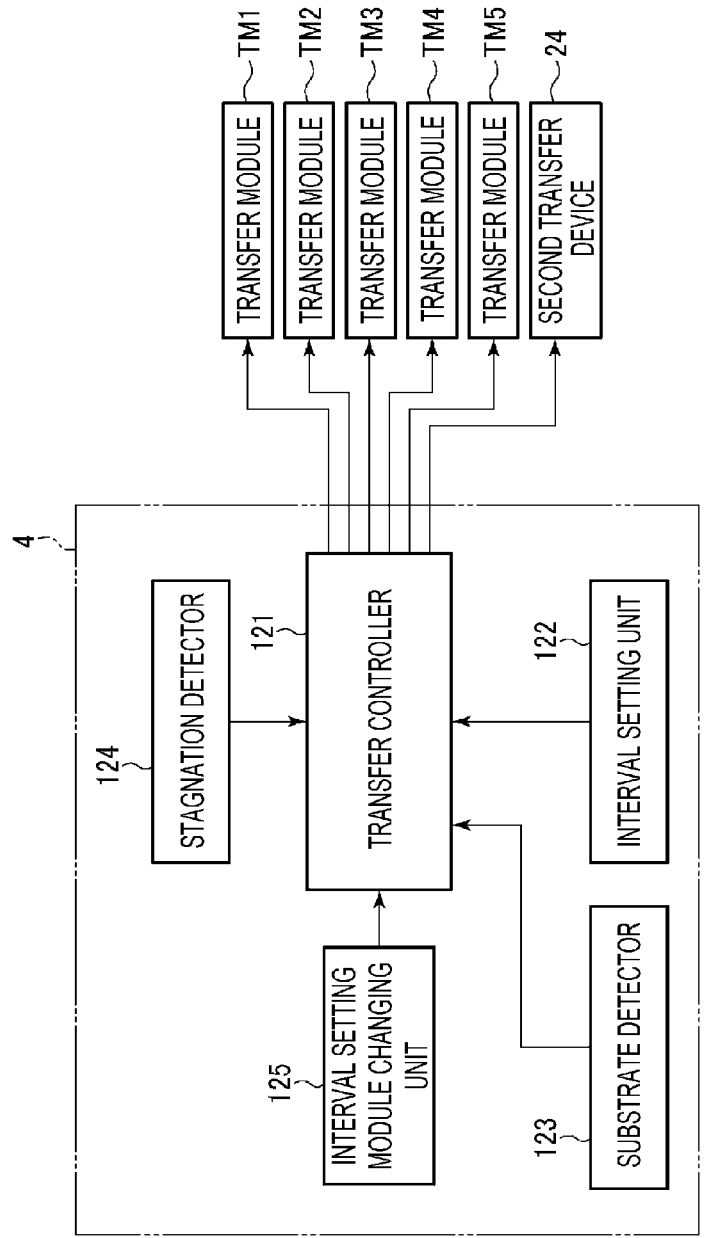
FIG. 4 is a functional block diagram of the controller in the substrate processing system according to the embodiment.

FIG. 4 is a functional block diagram of the controller 4, and mainly illustrates a transfer control function for substrates W. The controller 4 includes a transfer controller 121, an interval setting unit 122, a substrate detector 123, a stagnation detector 124, and an interval setting module changing unit 125. The controller 4 includes other functions in addition to the transfer control function, but descriptions thereof will be omitted herein.

The transfer controller 121 controls the transfer modules TM1 to TM5 (the transfer mechanisms 31a to 31e) and the second transfer device 24. Specifically, a control is performed such that a substrate W is carried out of the FOUP 20, reaches the processing section 2 via the aligner module 23 and the load lock module LLM1, is sequentially transferred to each of the process modules, and is returned to the FOUP 20 via the load lock module LLM2. A timer is incorporated in the transfer controller 121. The interval setting unit 122 has a function of setting an interval until a next substrate W is unloaded after a certain substrate W is unloaded from a predetermined module of the carry-in/out section 3, and sending the setting value to the transfer controller 121. The substrate detector 123 detects a location of a substrate W in the system. The detected location of the substrate W is displayed on a device screen of the display device 104. The stagnation detector 124 has a function of detecting stagnation of a substrate W, and feeding the detection back to the transfer controller 121. The interval setting module changing unit 125 has a function of setting a change of a module, for which an interval is set until a next substrate W is unloaded after a substrate W is unloaded, and sending the change to the transfer controller 121.

Hereinafter, specific descriptions will be made.

When a plurality of substrates is sequentially unloaded from a predetermined module of the carry-in/out section 3, the transfer controller 121 controls a transfer mechanism such as the second transfer device 24 so as to sequentially unload the plurality of substrates W with a setting value of an interval, which is set by the interval setting unit 122. Here, the interval is set as a device parameter. The interval setting unit 122 may change the interval into a proper value according to throughput required for a process.

The predetermined module for which the interval is set (the interval setting module) is, for example, the load port 22 (the FOUP 20). When the interval setting module is the load port 22 (the FOUP 20), the transfer controller 121 controls the second transfer device 24 such that after a substrate W is taken out from the FOUP 20, a next substrate W is taken out with the setting value of the interval set by the interval setting unit 122. The setting value of the interval setting unit 122 is set on the basis of, for example, the time of one with the longest processing time among the process modules PM1 to PM10.

The setting value (the parameter) set by the interval setting unit 122 may be changed on the way. In this case, it is desirable that the transfer controller 121 immediately makes the parameter change effective. When the parameter change is made after a preceding substrate is unloaded from the interval setting module (during interval timer measurement), the transfer controller 121 unloads a subsequent substrate after a timer time of a difference between the changed parameter and an actual measurement time at that time.

For example, followings are made for a case where the setting value (the parameter) of the interval is 120 sec:

(a) when 30 sec has elapsed after a preceding substrate is unloaded, in a case where the parameter is changed into 100 sec, a subsequent substrate is transferred after 70 sec from a point in time of the parameter change (after 100 sec from the unloading of the preceding substrate).

(b) when 30 sec has elapsed after a preceding substrate is unloaded, in a case where the parameter is changed into 10 sec, a subsequent substrate is unloaded immediately after a point in time of the parameter change.

The interval setting module changing unit 125 sets a change of the interval setting module. For example, the interval setting module is changed from the load port 22 (the FOUP 20), to the aligner module 23 or the load lock module LLM1. When the changed interval setting module is the aligner module 23, the transfer controller 121 controls the second transfer device 24 such that after a substrate W is unloaded from the aligner module 23, a next substrate W is taken out at the set interval. Here, the transfer controller 121 controls the second transfer device 24 such that when the substrate W is transferred from the FOUP 20 to the aligner module 23, a normal transfer is performed without taking the interval into consideration. When the changed interval setting module is the load lock module LLM1, the transfer controller 121 controls the transfer mechanism 31a of the transfer module TM1 such that after a substrate W is unloaded from the load lock module LLM1, a next substrate W is taken out at the set interval.

In the above description, the load port 22 (the FOUP 20) is set as the interval setting module at the initial stage, but another module may be set as the interval setting module at the initial stage.

When substrate stagnation has occurred in the predetermined process module in spite of the above interval setting, the stagnation detector 124 detects the stagnation, and feeds a stagnation time back to the transfer controller 121. The transfer controller 121 that has received the feedback extends a remaining time of the setting value of the interval set by the interval setting unit 122, by the stagnation time. In the stagnation detection of the stagnation detector 124, on the basis of a location detection result of a substrate W by the substrate detector 123, when a delay time in unloading of the substrate W from the predetermined module is a predetermined time or more, the substrate W is considered to be stagnating, and the unloading delay time is set as the stagnation time. Since the stagnation time is known only after the substrate has started to move, detection of the stagnation time is performed at a timing when the stagnation has been eliminated and the substrate W has started to move. The transfer controller 121 which has received the feedback resets the timer such that a remaining time of the interval set by the interval setting unit 122 is extended by the unloading delay time.

Meanwhile, in consideration of throughput reduction, it is desirable that the setting value in the interval setting unit 122 is set as a maximum value of the reset timer (that is, reset of the interval after the extension).

For example, followings are made for a case where the interval setting value set by the interval setting unit 122 is 280 sec.

(a) when a stagnation time of a preceding substrate is 30 sec, and an elapsed time of the timer is 100 sec, the timer is reset to 280−100+30=210 sec.

(b) when a stagnation time of a preceding substrate is 300 sec, and an elapsed time of the timer is 100 sec, 280−100+300=480 sec. However, since it is longer than the setting value (280 sec), the timer is reset to 280 sec.

It is desirable that it is possible to set the predetermined time by which the stagnation detector 124 determines stagnation. The predetermined time is set as a time by which it is possible to determine that the stagnation has occurred in actuality, for example, 15 sec. That is, when a delay time in unloading of a substrate W from the predetermined module is equal to or longer than the predetermined time (e.g., 15 sec), the stagnation detector 124 determines that the stagnation has occurred and sends feedback to the transfer controller 121.

When a plurality of substrates has started to move due to elimination of stagnation of the substrates W, the transfer controller 121 receives only a feedback of a substrate W that has started to move first. When a preceding substrate stagnates due to some reasons, substrates subsequent to the preceding substrate also stagnate, and then the plurality of substrates stagnate. Meanwhile, here, when the stagnation is eliminated, the plurality of substrates start to move, and feedbacks related to the plurality of substrates are sent from the stagnation detector 124. Since a stagnation time of the substrate that has started to move first among these substrates is longest, the transfer controller 121 receives only the feedback on the substrate that has started to move first.

On a substrate for which a feedback was transmitted once, the transfer controller 121 does not receive any subsequent feedback. When stagnation is eliminated after the stagnation of a plurality of substrates as described above, the first substrate is transferable without stagnation, but second or subsequent substrates may stagnate a plurality of times depending on a processing time of the first substrate in each process module. Here, when a feedback of the stagnation is received each time, the disturbance of a transfer cycle increases, resulting in throughput reduction. For this reason, the transfer controller 121 does not receive any feedback related to a substrate for which a feedback was transmitted once.

The transfer controller 121 has a function of stopping unloading of a substrate W from the interval setting module in a case where occurrence of stagnation of a preceding substrate W is detected in a module as a transfer destination of the substrate W when the substrate W is unloaded from the interval setting module due to elapse of the set interval. When the substrate detector 123 detects that the stagnation has been eliminated, the transfer controller 121 cancels the stop of the unloading.

The transfer controller 121 has a function of immediately unloading a next substrate W from the interval setting module regardless of the set interval time when there is no preceding substrate (when information on the preceding substrate is lost in a software manner). Likewise, in a case where the set interval time is longer than a transfer time of a preceding substrate W or a case where a process job of the preceding substrate W is aboard and the substrate is returned earlier than expected as well, a next substrate is immediately unloaded at a point in time the substrate is returned.

The transfer controller 121 has a function of unloading after completion of an atmospheric opening process regardless of the interval setting value when the first substrate W is unloaded from the interval setting module in a case where the atmospheric opening of the load lock module LLM1 is delayed.

Next, descriptions will be made on a processing operation in the substrate processing system 1 configured as described above. The following processing operation is executed under the control by the controller 4.

First, a substrate W is taken out from the FOUP 20 on the load port 22 by the second transfer device 24, and is transferred to the aligner module 23. After aligned in the aligner module 23, the substrate W is taken out by the second transfer device 24, and is transferred to the load lock module LLM1. Here, the load lock module LLM1 is placed at atmospheric pressure, and is evacuated after receiving the substrate W.

Then, the substrate W is taken out from the inside of the load lock module LLM1 by the transfer mechanism 31a of the transfer module TM1 in the first transfer device 11, and is transferred to the process module PM1. Then, a predetermined processing is executed for the substrate W in the process module PM1. Then, the substrate W is sequentially transferred to the process modules PM3, PM5, PM7, PM9, PM10, PM8, PM6, PM4, and PM2 by the transfer mechanisms 31a to 31e of the transfer modules TM1 to TM5, and is sequentially subjected to predetermined processings in these process modules. After the processing in the process module PM2 is completed, the substrate W is transferred to the load lock module LLM2 by the transfer mechanism 31a of the transfer module TM1. Here, the load lock module LLM2 is placed under vacuum, and is open to the atmospheric after receiving the substrate W.

Next, the substrate W within the load lock module LLM2 is transferred into the FOUP 20 of the load port 22 by the second transfer device 24.

A series of processings as described above is repeatedly performed on a plurality of substrates W.

Conventionally, in this type of substrate processing system, a transfer system has emphasized a transfer efficiency, and thus has been controlled such that a plurality of substrates is consecutively transferred in the shortest time by trigger transfer.

However, processing times of process modules are not constant. Even if it is possible to transfer the first substrate without a waiting time, second and subsequent substrates have to stand by in process modules prior to a process module with a long recipe time. This may result in different process results.

For example, in the case of manufacturing an MTJ film for a MRAM, there is a plurality of processings such as a pre-cleaning processing, a film forming processing, an oxidizing processing, a heating processing, and a cooling processing. At that time, for example, the processing time is longest (280 sec) in the process module PM7, and is several tens of seconds in the preceding process modules PM1, PM3, and PM5. Therefore, second and subsequent substrates stand by in the process modules PM1, PM3, and PM5 until the processing of a preceding substrate in the process module PM7 is completed.

Here, when the processings performed in the process modules PM1, PM3, and PM5 where the substrates stand by are processings such as an oxidizing processing or a cooling processing, which are likely to change the statuses of the stand-by substrates, the process results may differ between the first substrate and the second and subsequent substrates.

Meanwhile, it is possible to prevent the stagnation of the subsequent substrates and to suppress the unevenness of process results by spacing the substrates with a software function. However, when the substrates are spaced in the transfer while maintaining the existing control, the throughput is reduced.

Therefore, in the embodiment, the interval setting unit 122 sets an interval until a next substrate is unloaded after a certain substrate is unloaded from a predetermined module of the carry-in/out section 3, and the transfer controller 121 controls transfer of substrates W so as to sequentially unload the plurality of substrates with a setting value of the set interval from the interval setting module.

Accordingly, it is possible to properly set an unloading interval of the substrates W in accordance with the throughput required for a process. Thus, while suppressing throughput reduction, it is possible to eliminate stagnation of the substrates W in the process modules, and to suppress the unevenness of process results by the substrates.

The setting value of the interval setting unit 122 is set on the basis of the time of one with the longest processing time among the process modules PM1 to PM10. Thus, it is possible to more effectively suppress occurrence of substrate stagnation.

The setting value (the parameter) set by the interval setting unit 122 may be changed on the way, and the transfer controller 121 may immediately make the parameter change effective so that a transfer control may be minutely performed.

When a substrate W is processed as scheduled by all the process modules PM1 to PM10, and is transferred as scheduled, it is possible to effectively suppress stagnation of the substrate W only by such a function. However, in actuality, in some cases, an error or a sudden delay may occur in the process modules, and thus processings may not be performed in a scheduled time. In such a case, stagnation of the substrate W occurs even with the above function.

For this, the stagnation detector 124 detects the stagnation occurring in the predetermined process module, and feeds the detection back to the transfer controller 121 so that a remaining time of the setting value of the interval set by the interval setting unit 122 is extended by a delay time in unloading from the process module. Here, since a stagnation time is known only after a substrate has started to move, the stagnation detector 124 detects the stagnation when detecting a delay in unloading of the substrate W from the predetermined module, that is, at a timing when the stagnation has been eliminated and the substrate has started to move. Then, the transfer controller 121 which has received the feedback resets the timer such that the setting value (the parameter) set by the interval setting unit 122 is extended by the stagnation time. Accordingly, even when stagnation of a substrate W unexpectedly occurs, it is possible to suppress the waiting time of subsequent substrates, thereby preventing propagation of the stagnation.

Here, by setting the setting value of the interval in the interval setting unit 122 as a maximum value of the reset timer, it is possible to suppress throughput reduction as much as possible.

By making it possible to set a predetermined time by which the stagnation detector 124 determines stagnation, it is possible to prevent detection of even a minor thing that is not considered to be stagnant in actuality (such as struggling of a transfer module or re-try of plasma ignition in a processing unit), as stagnation.

When a plurality of substrates has started to move due to elimination of stagnation of the substrates W, feedback signals are transmitted from the plurality of substrates. However, the transfer controller 121 receives only a feedback of a substrate W that has started to move first. Since a stagnation time of the substrate W that has started to move first is longest, correspondingly, it is sufficient to extend the timer for the interval setting value. Accordingly, it is possible to suppress throughput reduction due to excessive adjustment of substrate transfer.

On a substrate for which a feedback was transmitted once, the transfer controller 121 does not receive any feedback. Accordingly, on second and subsequent substrates which are likely to be stagnated a plurality of times when stagnation is eliminated after the stagnation of a plurality of substrates, it is possible to avoid a transfer cycle from being disturbed due to reception of a stagnation feedback whenever stagnation occurs. That is, this may also suppress throughput reduction due to excessive adjustment of substrate transfer.

The transfer controller 121 has a function of stopping unloading of a substrate W in a case where occurrence of stagnation of a preceding substrate W is detected in a module as a transfer destination of the substrate W when the substrate W is unloaded from the interval setting module due to elapse of the set interval. Accordingly, it is possible to avoid the risk of stagnation of the substrate W newly unloaded from the interval setting module.

The transfer controller 121 has a function of immediately unloading a substrate W from the interval setting module regardless of the set interval time when there is no preceding substrate (when information on the preceding substrate is lost in a software manner). Accordingly, it is possible to eliminate an excessive waiting time, thereby further increasing throughput. Likewise, in a case where the set interval time is longer than a transfer time of a preceding substrate W or a case where the preceding substrate W is returned earlier than expected as well, the transfer controller 121 has a function of immediately unloading a next substrate at a point in time the substrate is returned. Thus, the same effect is achieved.

Since the interval setting module changing unit 125 may set a change of the interval setting module, it is possible to eliminate a problem caused by fixing of the interval setting module. For example, due to a long atmospheric opening time of the load lock module LLM1, even when the load lock module LLM1 starts to be open to atmospheric in unloading of a substrate W from the load port 22, the atmospheric opening may not be ended before the substrate W reaches the load lock module LLM1. In such a case, when the interval is set in the load port 22 (the FOUP 20), a transfer cycle is disturbed. In such a case, it is effective to change the interval setting module into the aligner module 23. Meanwhile, when the second transfer device 24 has two picks, there is a problem in a case where the interval setting module is the aligner module 23. Thus, on the premise that the atmospheric opening time of the load lock module LLM1 is short, the load port 22 is set as the interval setting module.

A control may be performed such that unloading may be performed after completion of an atmospheric opening process regardless of the interval setting value when the first substrate W is unloaded from the interval setting module in a case where the atmospheric opening of the load lock module LLM1 is delayed. Accordingly, it is possible to prevent the first substrate W not taking benefit of the interval setting, from waiting before being carried into the load lock module LLM1.

For example, the substrate processing system 1 of the embodiment is merely an example, and only has to sequentially and serially transfer substrates to a plurality of process modules and to perform a process. As an example of the process, the manufacturing of an MTJ film for a MRAM has been exemplified, but the present disclosure is not limited thereto.

According to the present disclosure, there is provided a technology capable of suppressing unevenness of process results by substrates while suppressing throughput reduction when the substrates are sequentially and serially transferred to a plurality of process modules that performs a plurality of processings, respectively, and are subjected to a series of processings From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system that performs a processing on a plurality of substrates, the substrate processing system comprising:
   a processing enclosure that includes a plurality of process modules each of which performs a predetermined processing;
   a carrying-in/out port including a substrate holder that holds the plurality of substrates and carries the substrates into/out of the processing enclosure;
   a transfer path including a transfer arm that transfers the substrates to each of the plurality of process modules and transfers the substrates within the carrying-in/out port and between the carrying-in/out port and the processing enclosure; and
   a controller that controls the processing enclosure, the carrying-in/out port, and the transfer path, wherein the controller performs a control such that the plurality of substrates is sequentially transferred from the carrying-in/out port to the processing enclosure, and the transferred substrates are sequentially and serially transferred to the plurality of process modules, sets an interval until a next substrate is unloaded after a substrate is unloaded from a predetermined module of the carrying-in/out port, and performs a control such that the plurality of substrates is sequentially unloaded from the predetermined module with a setting value of the interval, and the controller is configured to change the setting value of the interval according to a processing state of the substrates.

2. The substrate processing system according to claim 1, wherein the controller performs a control such that, when the setting value of the interval is changed after a preceding substrate is unloaded from the predetermined module, a subsequent substrate is unloaded after a time difference between a changed setting value of the interval and an actual measurement time at that time.

3. The substrate processing system according to claim 2, wherein when a stagnation of a substrate occurs in a predetermined process module, the controller detects the stagnation of the substrate, provides a feed-back on a result, and performs a resetting such that a remaining time of the interval is extended by a stagnation time.

4. The substrate processing system according to claim 3, wherein when the stagnation time in the predetermined process module is equal to or longer than a predetermined time, it is determined that the stagnation has occurred.

5. The substrate processing system according to claim 4, wherein at a timing when the stagnation has been eliminated and the substrate has started to move, the controller sets a delay time in unloading of the substrate from the predetermined process module as the stagnation time.

6. The substrate processing system according to claim 5, wherein when the substrate stagnation has been eliminated and the plurality of substrates has started to move, the controller receives only a feedback on a substrate that has started to move first.

7. The substrate processing system according to claim 5, wherein on a substrate for which a feedback on a stagnation result was provided once, the controller does not receive a subsequent feedback.

8. The substrate processing system according to claim 7, wherein a maximum value of a resetting value after the remaining time of the interval is extended is the setting value of the interval.

9. The substrate processing system according to claim 8, wherein the controller stops unloading of the substrate from the predetermined module in a case where occurrence of the stagnation of the substrate is detected in a module as a transfer destination of the substrate when the substrate is unloaded from the predetermined module due to an elapse of the set interval in the predetermined module.

10. The substrate processing system according to claim 9, wherein, when there is no preceding substrate, the controller immediately unloads the next substrate from an interval setting module regardless of the setting value of the interval.

11. The substrate processing system according to claim 1, wherein the carrying-in/out port includes a load port on which a container accommodating the plurality of substrates is placed, and the load port functions as the predetermined module for which the interval is set.

12. The substrate processing system according to claim 1, wherein the plurality of process modules in the processing section perform a processing in vacuum, the carrying-in/out port includes a load port on which a container accommodating the plurality of substrates is placed, an aligner that performs an alignment of the substrate, and a load lock chamber with a pressure variable between atmospheric pressure and vacuum, and the predetermined module for which the interval is set is any one of the load port, the aligner, and the load lock chamber.

13. The substrate processing system according to claim 12, wherein the controller is configured to change the predetermined module for which the interval is set.

14. The substrate processing system according to claim 1, wherein the controller is configured to change the setting value of the interval according to a detected value on a stagnation of the substrate in a process module.

15. The substrate processing system according to claim 1, wherein the processing state of the substrate includes a stagnation of the substrate in a process module.

16. A method of transferring substrates in a substrate processing system including a processing section that includes a plurality of process modules each of which performs a predetermined processing, and a carrying-in/out section that holds the plurality of substrates, and carries the substrates into/out of the processing section, the method comprising:

setting an interval until a next substrate is unloaded after a substrate held in the carrying-in/out section is unloaded from a predetermined module of the carrying-in/out section, and sequentially unloading the plurality of substrates from the predetermined module with a setting value of the interval;

transferring the substrates sequentially unloaded from the predetermined module to the processing section; and sequentially and serially transferring the substrates transferred to the processing section, to the plurality of process modules, wherein the setting value of the interval is changed according to a processing state of the substrates.

17. The method according to claim 16, wherein the processing state of the substrate includes a stagnation of the substrate in a process module.

18. A non-transitory computer-readable storage medium storing a control program that operates on a computer and controls transfer of substrates in a substrate processing system including a processing section that includes a plurality of process modules each of which performs a predetermined processing, and a carrying-in/out section that holds the plurality of substrates and carries the substrates into/out of the processing section, the control program causing the computer to perform a process comprising:

setting an interval until a next substrate is unloaded after a substrate held in the carrying-in/out section is unloaded from a predetermined module of the carrying-in/out section, and sequentially unloading the plurality of substrates from the predetermined module with a setting value of the interval;

transferring the substrates sequentially unloaded from the predetermined module to the processing section; and sequentially and serially transferring the substrates transferred to the processing section, to the plurality of process modules, wherein the setting value of the interval is changed according to a processing state of the substrates.

19. The non-transitory computer-readable storage medium according to claim 18, wherein the processing state of the substrate includes a stagnation of the substrate in a process module.

* * * * *